US007302043B2

(12) United States Patent
Bloom et al.

(10) Patent No.: US 7,302,043 B2
(45) Date of Patent: Nov. 27, 2007

(54) ROTATING SHUTTER FOR LASER-PRODUCED PLASMA DEBRIS MITIGATION

(75) Inventors: Scott H. Bloom, Encinitas, CA (US); Harry Rieger, San Diego, CA (US); James J. Alwan, Ramona, CA (US)

(73) Assignee: Gatan, Inc., Warrendale, PA (US)

( * ) Notice: Subject to any disclaimer, the term of this patent is extended or adjusted under 35 U.S.C. 154(b) by 0 days.

(21) Appl. No.: 11/161,237

(22) Filed: Jul. 27, 2005

(65) Prior Publication Data
US 2006/0067476 A1 Mar. 30, 2006

Related U.S. Application Data

(60) Provisional application No. 60/591,410, filed on Jul. 27, 2004.

(51) Int. Cl.
*G21K 1/00* (2006.01)
(52) U.S. Cl. .......................................... 378/143; 378/34
(58) Field of Classification Search ................... 378/34, 378/160, 119, 143, 145–162, 10, 120; 250/504 R, 250/517.21, 518.1, 503.1, 498.1
See application file for complete search history.

(56) References Cited

U.S. PATENT DOCUMENTS

| 3,647,984 A | 3/1972 | Watanabe |
| 3,723,246 A | 3/1973 | Lubin |
| 3,723,703 A | 3/1973 | Ehlers et al. |
| 3,907,477 A | 9/1975 | Jarboe et al. |
| 4,205,278 A | 5/1980 | George et al. |
| 4,266,506 A | 5/1981 | Miller |
| 4,317,036 A | 2/1982 | Wang |
| 4,344,911 A | 8/1982 | Maniscalo et al. |
| 4,376,752 A | 3/1983 | Nuckolls et al. |
| 4,432,933 A | 2/1984 | Teitel et al. |

(Continued)

FOREIGN PATENT DOCUMENTS

WO        WO94/26080        11/1994

(Continued)

OTHER PUBLICATIONS

International Search Report of PCT Application No. PCT/US03/41694 issued Nov. 16, 2004.

(Continued)

*Primary Examiner*—Hoon Song
(74) *Attorney, Agent, or Firm*—Caesar, Rivise, Bernstein, Cohen & Pokotilow, Ltd.

(57) ABSTRACT

A laser produced plasma device comprises a shutter assembly for mitigating the contaminating effects of debris generated by the plasma. In one embodiment, the shutter assembly includes a rotatable shutter having at least one aperture that provides a line-of-sight between a radiation source and an exit of the device during a first period of rotation of the shutter, and obstructs the line-of-sight between the radiation source and the exit during a second period of rotation. The shutter assembly in this embodiment also includes a motor configured to rotate the shutter to permit passage of the X-rays through the at least one aperture during the first period of rotation, and to thereafter rotate the shutter to obstruct passage of the debris through the at least one aperture during the second period of rotation.

17 Claims, 3 Drawing Sheets

U.S. PATENT DOCUMENTS

| | | |
|---|---|---|
| 4,463,413 A | 7/1984 | Shirley |
| 4,608,222 A | 8/1986 | Brueckner |
| 4,630,275 A | 12/1986 | Rapoport |
| 4,646,308 A | 2/1987 | Kafka et al. |
| 4,687,618 A | 8/1987 | Nuckolls et al. |
| 4,723,262 A | 2/1988 | Noda et al. |
| 4,735,762 A | 4/1988 | Lasche |
| 4,767,826 A | 8/1988 | Liang et al. |
| 4,853,191 A | 8/1989 | Bruening |
| 4,870,674 A | 9/1989 | Schmahl et al. |
| 4,896,341 A | 1/1990 | Forsyth et al. |
| 4,930,901 A | 6/1990 | Johnson et al. |
| 4,939,715 A | 7/1990 | Vogelgesang et al. |
| 4,979,203 A | 12/1990 | Suckewer et al. |
| 5,003,543 A | 3/1991 | Morsell et al. |
| 5,006,184 A | 4/1991 | Manusch et al. |
| 5,021,628 A | 6/1991 | Lemelson |
| 5,043,131 A | 8/1991 | Musinski et al. |
| 5,052,034 A | 9/1991 | Schuster |
| 5,081,635 A | 1/1992 | Wakabayashi et al. |
| 5,107,526 A | 4/1992 | Hoover |
| 5,122,506 A | 6/1992 | Wang |
| 5,131,023 A | 7/1992 | Yasugaki et al. |
| 5,131,957 A | 7/1992 | Epstein et al. |
| 5,132,994 A | 7/1992 | Kato |
| 5,140,600 A | 8/1992 | Rebhan |
| 5,157,684 A | 10/1992 | Benda et al. |
| 5,177,774 A | 1/1993 | Suckewer et al. |
| 5,204,887 A | 4/1993 | Hayashida et al. |
| 5,216,699 A | 6/1993 | Iketaki |
| 5,222,113 A | 6/1993 | Thieme et al. |
| 5,235,606 A | 8/1993 | Mourou et al. |
| 5,311,565 A | 5/1994 | Horikawa |
| 5,315,113 A | 5/1994 | Larson |
| 5,339,323 A | 8/1994 | Hunter et al. |
| 5,351,279 A | 9/1994 | She et al. |
| 5,434,875 A | 7/1995 | Rieger et al. |
| 5,434,901 A | 7/1995 | Nagai et al. |
| 5,450,463 A | 9/1995 | Iketaki |
| 5,459,771 A | 10/1995 | Richardson |
| 5,487,094 A | 1/1996 | Sudo |
| 5,491,707 A | 2/1996 | Rieger et al. |
| 5,539,764 A | 7/1996 | Shields et al. |
| 5,544,133 A | 8/1996 | Sin |
| 5,550,887 A | 8/1996 | Schmal et al. |
| 5,577,091 A | 11/1996 | Richardson |
| 5,590,168 A | 12/1996 | Iketaki |
| 5,668,848 A | 9/1997 | Rieger |
| 5,680,018 A | 10/1997 | Yamada |
| 5,680,429 A | 10/1997 | Hirose et al. |
| 5,742,634 A | 4/1998 | Rieger et al. |
| 5,790,574 A | 8/1998 | Rieger |
| 5,790,627 A | 8/1998 | Iketaki |
| 5,832,052 A | 11/1998 | Hirose et al. |
| 5,864,599 A | 1/1999 | Cowan et al. |
| 5,991,360 A | 11/1999 | Matsui et al. |
| 6,002,744 A | 12/1999 | Hertz et al. |
| 6,016,324 A | 1/2000 | Rieger et al. |
| 6,157,701 A | 12/2000 | Hirose et al. |
| 6,167,112 A | 12/2000 | Schneider |
| 6,188,746 B1 | 2/2001 | Miley et al. |
| 6,275,565 B1 | 8/2001 | Tomie |
| 6,304,630 B1 | 10/2001 | Bisschops et al. |
| 6,307,913 B1 | 10/2001 | Foster et al. |
| 6,377,651 B1 | 4/2002 | Richardson |
| 6,389,101 B1 | 5/2002 | Levine et al. |
| 6,418,177 B1 | 7/2002 | Stauffer et al. |
| 6,472,295 B1 | 10/2002 | Morris et al. |
| 6,507,641 B1 | 1/2003 | Kondo et al. |
| 6,522,717 B1 | 2/2003 | Murakami et al. |
| 6,624,431 B1 | 9/2003 | Foster |
| 6,720,556 B2 | 4/2004 | Cohen et al. |
| 6,831,963 B2 | 12/2004 | Richardson |
| 6,862,339 B2 | 3/2005 | Richardson |
| 6,865,255 B2 | 3/2005 | Richardson |
| 6,867,843 B2 * | 3/2005 | Ogushi et al. ............... 355/30 |
| 7,057,190 B2 * | 6/2006 | Bakker et al. ........... 250/492.2 |
| 2002/0018288 A1 | 2/2002 | Rieger et al. |
| 2002/0034879 A1 | 3/2002 | Yun et al. |
| 2002/0070353 A1 | 6/2002 | Richardson |
| 2002/0141536 A1 | 10/2002 | Richardson |
| 2002/0191746 A1 | 12/2002 | Dinsmore |
| 2003/0010791 A1 | 1/2003 | Gentiluomo |
| 2003/0210717 A1 | 11/2003 | Rieger et al. |
| 2004/0108473 A1 | 6/2004 | Melnychuk |
| 2004/0170252 A1 | 9/2004 | Richardson |
| 2004/0171017 A1 | 9/2004 | Fiarro |
| 2004/0196883 A1 | 10/2004 | Rieger |
| 2004/0200977 A1 | 10/2004 | Rieger et al. |
| 2004/0208286 A1 | 10/2004 | Richardson |
| 2004/0238762 A1 | 12/2004 | Mizoguchi et al. |

FOREIGN PATENT DOCUMENTS

| WO | WO 01/31678 A1 | 5/2001 |
|---|---|---|

OTHER PUBLICATIONS

"Nanomachining of High Aspect Ratio Structures", Technology Transfer www.lbl.gov/Tech-Transfer/techs/lbnll498.html.

L. Rymell, H.M. Hertz; Droplet target for low-debris laser-plasma soft X-ray generation; Optics Communications 103 (1993) 105-110.

* cited by examiner

ROTATING SHUTTER FOR LASER-PRODUCED PLASMA DEBRIS MITIGATION

CROSS-REFERENCE TO RELATED APPLICATION

This application claims the benefit of U.S. Provisional Application Ser. No. 60/591,410, filed on Jul. 27, 2004 entitled "Razor Array Shutter for LPP Debris Mitigation" commonly assigned with the present application and incorporated herein by reference in its entirety for all purposes.

TECHNICAL FIELD

This disclosure generally relates to laser-produced plasma (LPP) devices, and more particularly to devices and methods for obstructing the passage of debris from an LPP device through the use of a rotating debris shutter during a radiation generating event.

BACKGROUND

Laser-produced plasma (LPP) devices are an attractive source of X-rays or short-wavelength radiation due to their relative small size, high brightness and high spatial stability. Two established applications for LPP are microscopy and lithography. However, conventional LPP devices utilize solid targets that produce debris that may easily contaminate, coat, or destroy sensitive X-ray components, such as optics or zone plates, that are positioned close to the plasma. Unfortunately, increasing the distance or introducing filters in order to protect the components typically reduces the amount of radiation that can be captured or utilized.

For convenience, solid targets have often been used for LPP soft X-ray sources. Examples of solid target LPP systems are described in U.S. Pat. Nos. 5,539,764; 6,016,324; 6,307,913; and 6,707,101, all of which are hereby incorporated by reference herein in their entirely for all purposes. In general, targets formed from materials having low molecular weights yield emission spectra that are very narrow, while targets formed from materials having high molecular weights yield emission spectra having continuum radiation due to Brehmsstrahlung emission. Thus, low molecular weight targets are desirable for LPP applications. Unfortunately, with low molecular weight targets, significant amounts of debris, e.g., hot ions and larger particles, are created. In addition, such debris often follows the generated X-rays out of the laser ablation chamber of the LPP device, which can contaminate or damage components outside of the chamber as well.

Several methods have been developed to reduce the effect of debris, such as using a small back pressure of helium or other gas, or strategically locating a relay mirror for the protection of sensitive components. Additionally, thin film tape targets, which are becoming more commonplace, help reduce the amount of debris by avoiding shock wave ejection or delayed evaporation. Unfortunately, significant amounts of debris particles are produced, presumably from cooler zones illuminated by the noncentral parts of the laser beam. Gas-phase targets have been another low-debris alternative; however, such low density results in low X-ray intensity.

Other approaches to debris reduction have included waterjet devices and liquid droplets used for the laser target. However, even these approaches still result in the creation of some amount of debris when the X-rays are generated, and thus the potential for debris escaping the vacuum chamber and potentially contaminating and/or damaging outside components still exists. Accordingly, since the production of debris within a typical LPP device is difficult to eliminate, devices and methods are needed to prevent the LPP-generated debris from exiting the vacuum chamber and damaging delicate components of the LPP device.

SUMMARY

Disclosed are devices and methods for mitigating the exit of debris from a laser-produced plasma (LPP) device during a laser ablation process. In one embodiment, an LPP device comprises a laser source for generating a laser used for irradiation of a target, and a radiation source (sometimes called a "point source") that generates short-wavelength radiation (e.g., X-rays) and debris by irradiating the target with the laser so as to generate a plasma. In these embodiments, the LPP device also includes a shutter assembly for mitigating the damaging effects of the ablated debris, where the shutter assembly includes a rotatable shutter having at least one aperture that provides a line-of-sight between the radiation source and an exit of the device during a first period of rotation of the shutter, and obstructs the line-of-sight between the radiation source and the exit during a second period of rotation. The shutter assembly in this embodiment also includes a motor configured to rotate the shutter to permit passage of the X-rays through the at least one aperture and to the exit during the first period of rotation, and to thereafter rotate the shutter to obstruct the passage of the debris through the at least one aperture during the second period of rotation.

In another embodiment, a method for mitigating debris in an LPP device comprises providing a rotatable shutter having at least one aperture, and rotating the shutter a first period of its rotation to provide a line-of-sight between a radiation source and an exit of the device through the at least one aperture. In this embodiment, the method further includes rotating the shutter a second period of its rotation to provide no line-of-sight between the radiation source and the exit through the at least one aperture. Additionally, in such a method, rotating the shutter during the first period of rotation permits passage of radiation generated at the radiation source through the at least one aperture and to the exit, and thereafter rotating the shutter during the second period of rotation obstructs the passage of debris generated at the radiation source through the at least one aperture and to the exit.

DETAILED DESCRIPTION

Figure 1:
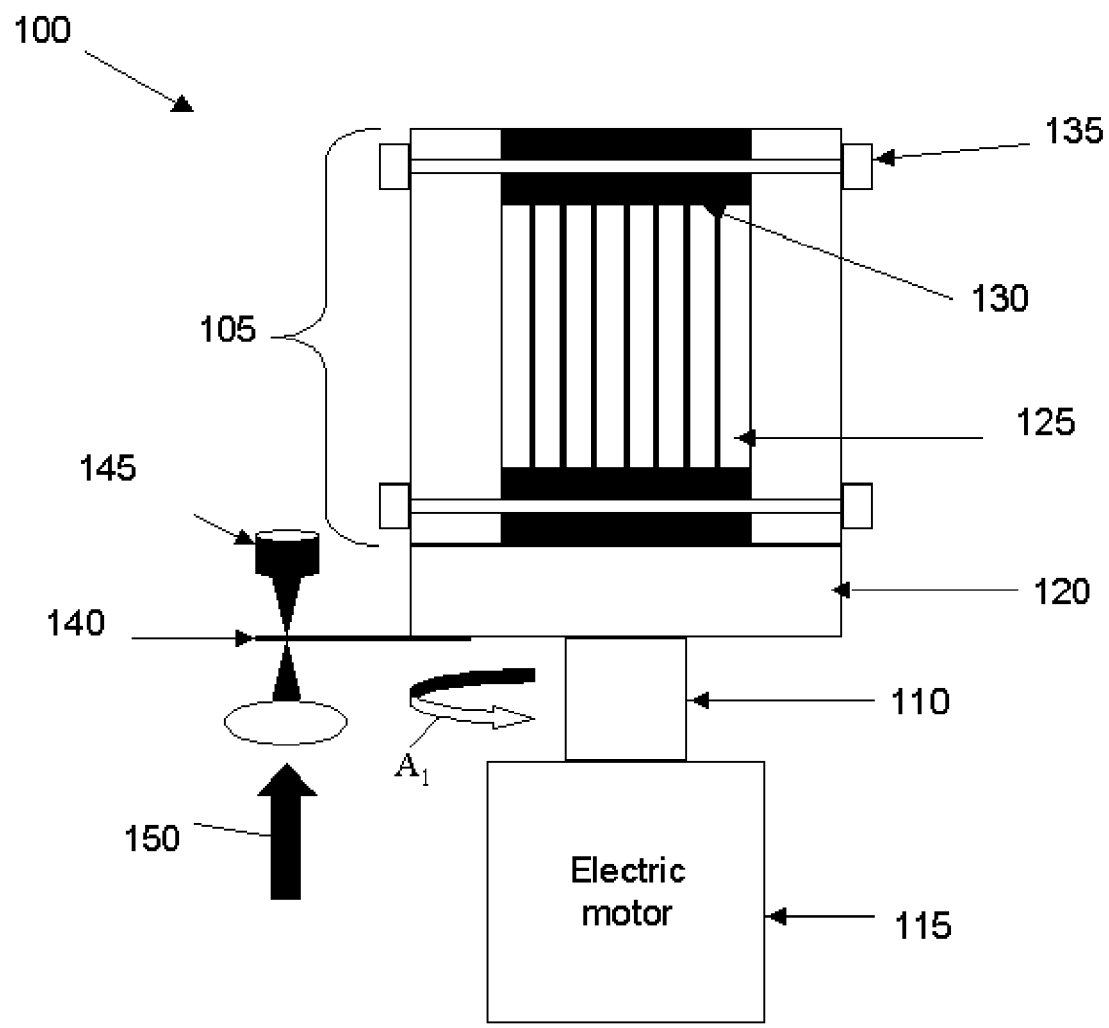
FIG. 1 illustrates one embodiment of a shutter assembly constructed according to the disclosed principles for use with a laser-produced plasma (LPP) device.

Referring initially to FIG. 1, illustrated is one embodiment of a shutter assembly 100 constructed according to the disclosed principles for use with a laser-produced plasma (LPP) device. The assembly 100 is included in the vacuum chamber of the LPP device (see FIG. 2) to reduce or eliminate debris produced by the radiation generating process from exiting the vacuum chamber with the generated X-rays.

The assembly 100 includes a shutter 105 mounted on a rotating shaft 110, which is connected to a motor 115. As discussed in greater detail below, the motor 115 and shaft 110 are used to rotate the shutter 105 (as indicated by arrow $A_1$) at a precise angular velocity selected to allow X-rays or other short-wavelength radiation to pass through the shutter 105, but block most or all of the unwanted debris from passing through the shutter 105. The shutter 105 includes a base 120 and a plurality of openings or apertures 125 created between multiple vanes or blades. The blades are held together and precisely spaced using spacers 130 placed between the blades and held together using fasteners, such as bolts 135. In some embodiments, the vanes may be constructed of metal for durability; however, in other embodiments the vanes may be constructed of plastic or other material. Moreover, construction techniques for the vanes/shutter can include cutting the component from a solid material, such as with an EDM device; however, even manufacturing technique may be employed.

In accordance with the disclosed principles, the shutter 105 reduces or eliminates the amount of debris created through the laser irradiation process used to generate X-rays in the LPP device by timing the alignment of the apertures 125 with the X-rays to be collected at the output of the vacuum chamber. Specifically, when a laser is used to irradiate a target, such as copper tape, X-rays are generated from the plasma created by the irradiation of the target. In addition, debris from the irradiated target in the form of projectile or ballistic particles is also generated at the radiation source. However, since the X-rays travel much faster than the ballistic debris, the rotation of the shutter 105 is timed so that the X-rays will pass through the apertures 125 in the shutter 105 at the desired time. But the rotation of the shutter 105 is also timed so that after the X-rays pass through the apertures 125, the shutter 105 turns to obstruct the ballistic debris traveling in the same or similar direction as the collected X-rays. Thus, this debris impacts the blades of the shutter 105 and most if not all of it cannot reach the output of the chamber where the X-rays were collected.

In the illustrated embodiment, to time the rotation of the shutter 105 with the laser ablation process, a synchronization device having a blade 140 is formed on the rotating base 120. In this approach, a photodetector 145 receives a light or laser beam 150, and the blade 140 interrupts the beam 150 at a given point during the rotation of the shutter 105. Thus, the firing of the laser generator that irradiates the target material to create the X-rays (and the resulting debris) can be timed by when the blade 140 interrupts the beam 150. Of course, this timing adjustment also takes into account the speed of the X-rays and the debris, as well as the rotational velocity of the rotating shutter 105 and its distance from the radiation source. A more detailed example having such parameters is discussed with reference to FIG. 2.

Figure 2:
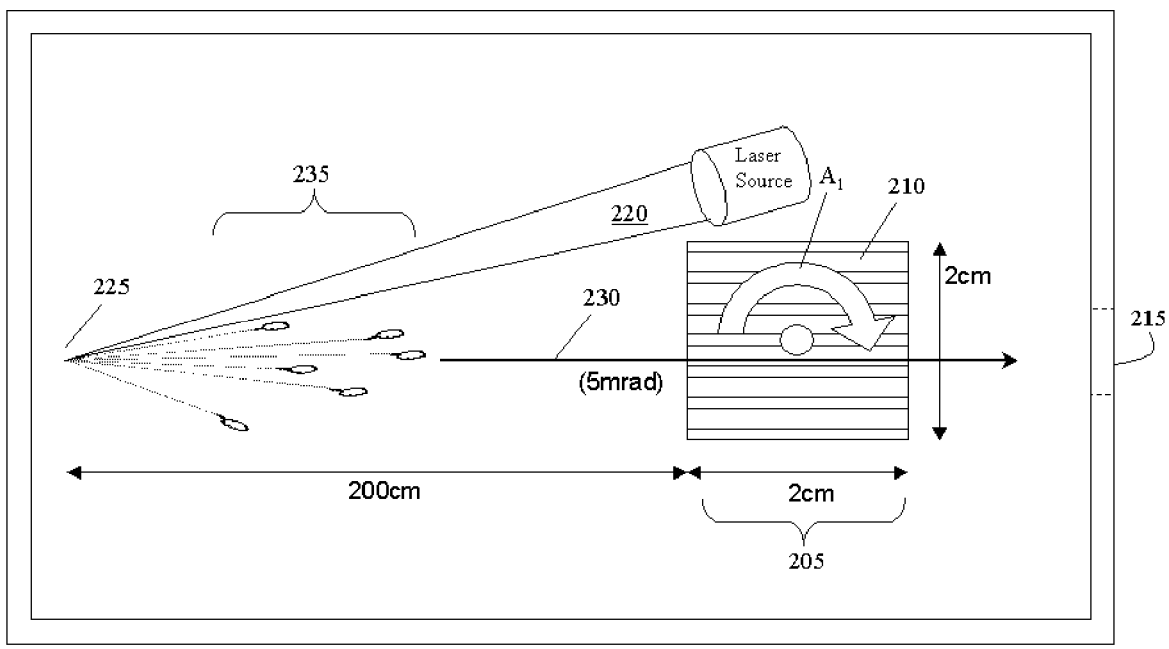
FIG. 2 illustrates a plan view of a vacuum chamber of an LPP device, which provides an environment for implementing a rotational mechanical shutter as disclosed herein.

FIG. 2 illustrates a plan view of a vacuum chamber 200 of an LPP device, which provides an environment for implementing a rotational mechanical shutter as disclosed herein. The embodiment in FIG. 2 also illustrates a different embodiment of a rotational shutter 205 constructed in accordance with the disclosed principles. In this embodiment, the shutter 205 has a square shape and still includes apertures 210 created by the spacing of a plurality of blades. As before, the shutter 205 is configured to rotate (shown by arrow $A_1$) on a shaft in order to align the apertures 210 with the output 215 of the vacuum chamber 200 at only desired times.

In operation, as mentioned above, a laser 220 is generated from a source external to the vacuum chamber 200. That laser 220 is then directed and focused to precisely impact a target (not illustrated) to generate a radiation source 225. The radiation source 225 created by the irradiation process forms a plasma that generates X-rays 230, as well as debris 235. The debris 235 typically consists of particles of the target that have been ablated during the irradiation process. As illustrated, the rotation of the shutter 210 is timed with the irradiation process such that the desired X-rays 230 are allowed to pass through the apertures 210 of the shutter 205 to the output 215 of the chamber 200 to be collected and harnessed as needed.

Since the generated X-rays 230 travel much faster than the generated debris 235, the rotation of the shutter 205 is also timed so that the apertures 210 no longer provide a line-of-sight between the radiation source 225 and the output 215 of the vacuum chamber 200 by the time that the debris 235 reaches the shutter. As a result, debris 235 with the same or similar trajectory as the X-rays 230 will not be permitted to pass through the shutter 205 to the output 215. Thus, most or all of this debris 235 will be prevented from exiting the chamber 200 at the point where the X-rays 230 are collected. Moreover, as the shutter 205 continues its rotation to allow the next batch of generated X-rays to pass through the apertures, the vanes or blades of the shutter 205 further work to brush or knock away debris 235 that may be lingering near the shutter 205 after its prior rotation obstructed the line-of-sight to the output 215.

By obstructing the path of the debris 235, equipment and other components of the LPP device proximate to the output 215 of the chamber 200 will receive much less contamination by the debris 235. Accordingly, cleaning or replacement of these components is reduced or even eliminated. Maintenance time and costs on the LPP device may consequently be reduced by obstructing debris with a shutter constructed and operated according to the disclosed principles.

In the embodiment illustrated in FIG. 2, the shutter 205 is again constructed in the shape of a square and, in this example, has dimensions of approximately 2 cm on all sides. Of course, other sizes and shapes for a shutter constructed as disclosed herein may be utilized. Moreover, in the illustrated embodiment of FIG. 2, the shutter 205 is located 200 cm from the radiation source 225. By taking into account these dimensions, as well as other parameters of the X-ray generation process, the precise rotation of the shutter 205 needed to perform as disclosed herein can be easily calculated. For example, if a source laser 220 and target are selected such that X-rays 230 of about 5 mrad are generated, the X-rays 230 are transmitted at the speed of light ($3.0 \times 10^{10}$ cm/sec). In addition, if the debris 235 from this particular ablation process is determined to be traveling at approximately $10^5$ cm/sec or slower, then the rotation of this embodiment of the shutter 205 (e.g., having apertures 210 that are approximately 1.2 mm wide and lengths of 2 cm in this example) may be calculated to be about 0.06 radians in 2 ms. Through conversion, in order to travel 0.06 radians in 2 ms, it is determined that the shutter 205 should be rotated at about 5 Hz, or 300 rpm. With these parameters, the shutter 205 should be capable of blocking about 90% of debris 235 traveling at this velocity at the outer edges of the shutter 205, while blocking about 100% of such debris 235 at the center of the shutter 205. In other examples, where faster debris is present, the rotational speed of the shutter 205 can be adjusted. For example, for debris traveling at a velocity of $10^6$ cm/sec, it is determined that the rotation of the shutter 205 should be about 3000 rpm, rather than the previous 300 rpm. Of course, as the rotation of the shutter 205 is adjusted, so too can the timing of the firing of the source laser beam 220 used in the ablation process be adjusted to work in tandem with the debris shutter 205.

Figure 3A:
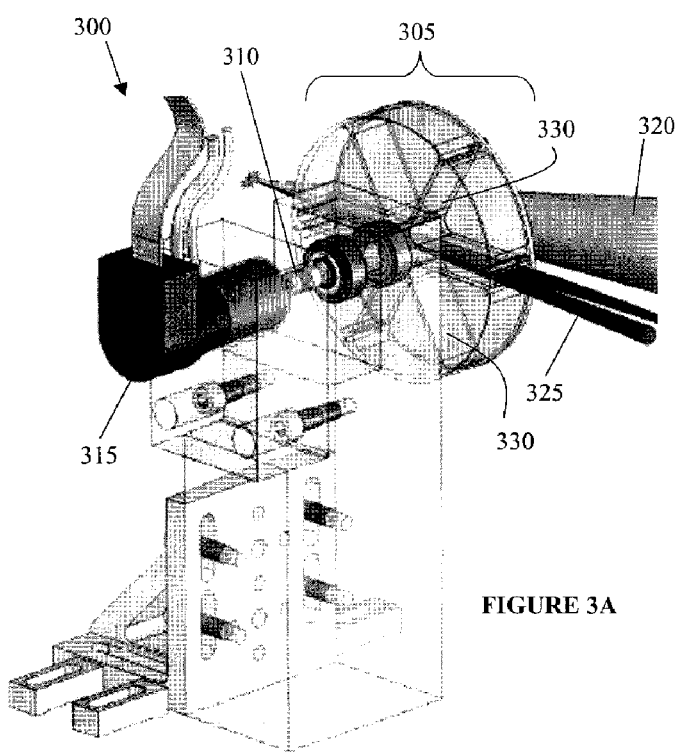
FIGS. 3A & 3B illustrate another embodiment of a shutter assembly according to the disclosed principles and having a shutter with radially extending apertures.
Figure 3B:
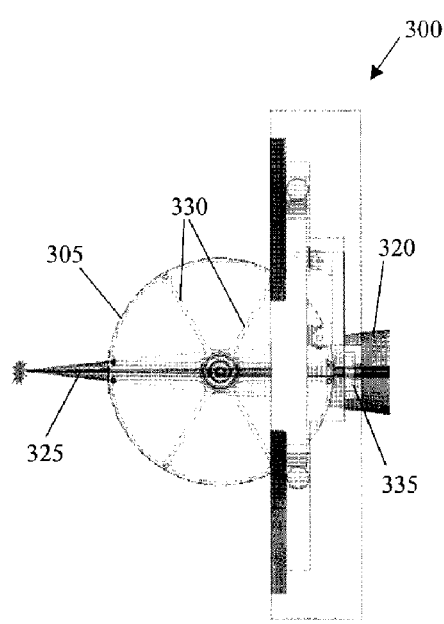

Turning finally to FIGS. 3A and 3B concurrently, illustrated is another embodiment of a shutter assembly 300 constructed according to the disclosed principles. This embodiment provides a "wheel" type shutter 305 that differs from the embodiments discussed above with reference to FIGS. 1 and 2. As before, the shutter 305 is again mounted on a rotating shaft 310 at the center of the shutter 305. In this embodiment, the shaft 310 is coupled to an encoded motor 315 that is configured to rotate the shutter 305 at the precise, needed velocity. More specifically, rather than including the blade and photodetector used in the embodiment of FIG. 2 for synchronizing the laser ablation process with the rotation of the shutter, the encoded motor 315 may be employed to provide such alignment and timing.

Once aligned, a laser 320 is fired at a target to generate a radiation source, as discussed above. The generated X-rays 325 travel from the radiation source to the exit or output 335 of the chamber. As seen from the figures, the shutter 305 is rotated so that the X-rays 325 are permitted to travel through rotating openings or apertures 330 in the shutter 305 to the output 335 of the chamber. This embodiment of the shutter 305 includes apertures 330 that are radially arranged within the shutter 305, and extend through its center. With this arrangement, as the shutter 305 rotates about its center, the apertures 330 provide a line-of-sight between the radiation source and the output 335 of the vacuum chamber. Moreover, although only three apertures 330 are illustrated extending through the diameter of the shutter 305, it should be noted that any number of apertures 330 may be included in the shutter 305. The rotation of the shutter 305, and consequently the alignment of the apertures 330 with the path of the X-rays and blocking of debris, may then be adjusted to account for the change in the number apertures 330 provided in the shutter 305.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes that come within the meaning and ranges of equivalents thereof are intended to be embraced therein.

Additionally, the section headings herein are provided for consistency with the suggestions under 37 C.F.R. § 1.77 or otherwise to provide organizational cues. These headings shall not limit or characterize the invention(s) set out in any claims that may issue from this disclosure. Specifically and by way of example, although the headings refer to a "Technical Field," the claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in the claims found herein. Furthermore, any reference in this disclosure to "invention" in the singular should not be used to argue that there is only a single point of novelty claimed in this disclosure. Multiple inventions may be set forth according to the limitations of the multiple claims associated with this disclosure, and the claims accordingly define the invention(s), and their equivalents, that are protected thereby. In all instances, the scope of the claims shall be considered on their own merits in light of the specification, but should not be constrained by the headings set forth herein.

What is claimed is:

1. A shutter assembly for mitigating debris in a laser-produced plasma device, the shutter assembly comprising:
   a rotatable shutter having at least one aperture that provides a line-of sight between a radiation source and an exit of the device during a first period of rotation of the shutter, and wherein the shutter obstructs the line-of-sight between the radiation source and the exit during a second period of rotation; and
   a motor configured to rotate the shutter to permit passage of radiation through the at least one aperture during the first period of rotation, and to obstruct the passage of debris generated at the radiation source through the at least one aperture during the second period of rotation, wherein the shutter further comprises a plurality of vanes arranged in parallel defining a plurality of parallel apertures.

2. A shutter assembly according to claim 1, wherein the shutter further comprises a plurality of apertures radially extending from a center of the shutter.

3. A shutter assembly according to claim 1, further comprising a synchronization device configured to synchronize the first period of rotation with a radiation generation event at the radiation source.

4. A shutter assembly according to claim 3, wherein the synchronization device comprises an encoded motor configured to generate a synchronization signal.

5. A shutter assembly according to claim 3, wherein the synchronization device comprises a blade coupled to the shutter, wherein the blade is configured to synchronize the first period of rotation with the radiation generating event by blocking a laser beam during the first or second period of rotation.

6. A shutter assembly according to claim 1, wherein the motor is further configured to rotate the shutter at about 300 RPM when the radiation source generates X-rays and the debris generated at the radiation source has a velocity of about $10^5$ cm/sec or slower.

7. A shutter assembly according to claim 1, wherein the motor is further configured to rotate the shutter at about 3000 RPM when the radiation source generates X-rays and the debris generated at the radiation source has a velocity of about $10^6$ cm/sec or slower.

8. A method for mitigating debris in a laser-produced plasma device, the method comprising:
   providing a rotatable shutter having at least one aperture;
   rotating the shutter to provide a line-of-sight between a radiation source and an exit of the device through the at least one aperture during a first period of rotation;
   rotating the shutter to obstruct the line-of-sight between the radiation source and the exit during the second period of rotation; and
   whereby rotating the shutter during the first period of rotation permits the passage of radiation generated at the radiation source through the at least one aperture to the exit, and obstructs the passage of debris generated at the radiation source through the at least one aperture during the second period of rotation,
wherein the shutter further comprises a plurality of vanes arranged in parallel defining a plurality of parallel apertures.

9. A method according to claim 8, wherein the shutter further comprises a plurality of apertures radially extending from a center of the shutter.

10. A method according to claim 8, further comprising synchronizing the first period of rotation with a radiation generating event at the radiation source.

11. A method according to claim 10, wherein synchronizing the first period of rotation further comprises generating a synchronization signal with an encoded motor configured to rotate the shutter.

12. A method according to claim 10, wherein synchronizing the first period of rotation further comprises obstructing a laser beam during the first or second portion of the rotation with a blade coupled to the shutter, the obstruction configured to synchronize the first period of rotation with the radiation generating event.

13. A method according to claim 8, wherein the shutter is rotated at about 300 RPM wherein the radiation source generates X-rays and the debris generated at the radiation source has a velocity of about $10^5$ cm/sec or slower.

14. A method according to claim 8, wherein the shutter is rotated at about 3000 RPM and wherein the radiation source generates X-rays and the debris generated at the radiation source has a velocity of about $10^6$ cm/sec or slower.

15. A laser-produced plasma device, comprising:
a laser source for laser irradiation of a target;
a radiation source comprising a target that forms a plasma that generates short-wavelength radiation and generates debris when irradiated by the laser; and
a shutter assembly for obstructing the passage of debris through an exit, the shutter assembly comprising:
a rotatable shutter having at least on aperture that provides a line-of-sight between the radiation source and the exit of the device during a first period of rotation of the shutter, and obstructs a line-of-sight between the radiation source and the exit during a second period of rotation, and
a motor configured to rotate the shutter to permit passage of the radiation through the at least one aperture during the first period of rotation, and to obstruct the passage of the debris through the at least one aperture during the second period of rotation, wherein the shutter further comprises a plurality of vanes arranged in parallel defining a plurality of parallel apertures.

16. A laser-produced plasma device according to claim 15, wherein the shutter further comprises a plurality of apertures radially extending from a center of the shutter.

17. A shutter assembly according to claim 15, further comprising a synchronization device configured to synchronize the first period of rotation with the radiation generating event.

* * * * *